United States Patent [19]

Maehara

[11] Patent Number: 5,350,948
[45] Date of Patent: Sep. 27, 1994

[54] SEMICONDUCTOR DEVICE

[75] Inventor: Masaaki Maehara, Ohme, Japan

[73] Assignee: Hitachi, Ltd., Tokyo, Japan

[21] Appl. No.: 49,361

[22] Filed: Apr. 21, 1993

[30] Foreign Application Priority Data

Apr. 28, 1992 [JP] Japan .................................. 4-109422

[51] Int. Cl.$^5$ ............................................ H01L 23/48
[52] U.S. Cl. .................................. 257/763; 257/587;
257/592; 257/751; 257/758; 257/765
[58] Field of Search ............... 257/763, 758, 751, 765,
257/587, 592

[56] References Cited

U.S. PATENT DOCUMENTS 4,107,726  8/1978  Schilling .
4,937,657  6/1990  DeBiasi et al. ....................... 257/763
5,191,405  3/1993  Tomita et al. ....................... 257/763

Primary Examiner—Edward Wojciechowicz
Attorney, Agent, or Firm—Pennie & Edmonds

[57] ABSTRACT

Technology capable of simultaneously improving the state of filling in connection holes and the reliability of a wiring material in a bipolar semiconductor device or in a bipolar CMOS device. At least a tungsten film formed by the CVD method is included in a first wiring layer that accomplishes electrical conduction among the semiconductor elements by depositing an electrically conducting film on the connection holes formed in an insulating film deposited on the main surface of a semiconductor substrate. The tungsten film formed by the CVD method helps improve the state of filling in connection holes or deposition property, and enables the connection holes to be formed highly reliably. By using a tungsten film, furthermore, it is allowed to increase the resistance against electromigration of the wiring and to enhance reliability.

6 Claims, 4 Drawing Sheets

SEMICONDUCTOR DEVICE

BACKGROUND OF THE INVENTION

The present invention relates to a wiring structure of a semiconductor device and, particularly, to technology that can be effectively adapted to the structure of the first wiring layer in a bipolar-type semiconductor device or in a bipolar CMOS device.

Selective tungsten plugging technology, whole surface tungsten-CVD technology, fellow technology by melting aluminum, aluminum bias sputtering technology, and taper (round) machining technology for connection holes, have heretofore been proposed to improve the state of filling in connection holes such as contact holes or like holes formed in the insulating film, i.e., to improve deposition property of electrically conducting films in a process for forming a first wiring layer of a semiconductor device.

Furthermore, a laminated film structure of a titanium nitride film and an aluminum alloy or like structures have been known to improve reliability of a wiring material such as resistance against migration and like properties in a process of forming a first wiring layer of a bipolar semiconductor device and a bipolar CMOS device.

A semiconductor device having wiring of such a laminated film structure has been described in, for example, U.S. Pat. No. 4,107,726 (Schilling: date of patent, Aug. 15, 1978).

As the bipolar semiconductor devices and bipolar CMOS devices are fabricated in ever fine structures, however, limitation is obviously imposed on the prior art that are related to the bipolar semiconductor devices and bipolar CMOS devices.

In the prior art, the state of filling in connection holes and the reliability of the wiring material can be easily improved by using the laminated film structure of a titanium nitride film and an aluminum alloy together with a hole tapering technique. However, hole tapering becomes difficult as the structure becomes fine. Therefore, another method must be studied in an attempt to improve the state of filling in the connection holes and to improve reliability of the wiring material.

However, the above-mentioned conventional selective tungsten plugging technology which must include peripheral technology such as selecting the tungsten film and adjusting the filling amount, has not yet been established as a mass-production technology. Moreover, tungsten (W) has a large resistance which creates a large CR time constant and develops a signal delay. Therefore, tungsten has heretofore been used for the LSIs of relatively slow speeds but has not been used for such bipolar semiconductor devices as high-speed LSIs or for the bipolar CMOS semiconductor devices. Furthermore, no striking progress can be expected from the fellow technology by melting aluminum or from the aluminum bias sputtering technology in regard to filling the connection holes and improving reliability of the wiring material.

SUMMARY OF THE INVENTION

The object of the present invention therefore is to provide technology that is capable of simultaneously improving the state of filling in connection holes and reliability of a wiring material in a bipolar semiconductor device and in a bipolar CMOS device.

The above and other objects as well as novel features of the present invention will become obvious from the description of the specification and the accompanying drawings.

Briefly described below is a representative example of the invention disclosed in this application.

A semiconductor device comprising:

a plurality of bipolar transistors provided on the main surface of a semiconductor substrate;

an insulating film provided on the main surface of said semiconductor substrate so as to cover said plurality of bipolar transistors; and a first wiring layer provided on said insulating film; wherein said first wring layer is electrically connected to said bipolar transistors via a plurality of connection holes formed in said insulating film, and the material of said first wiring layer includes at least a tungsten film formed by the CVD method.

According to the above-mentioned means, the state of filling in connection holes is improved owing to a high coverage layer formed by the CVD method, the resistance against the electromigration is improved owing to the use of tungsten, the current density can be increased in the wiring, and a semiconductor device can be highly densely fabricated and to operate at high speeds

DESCRIPTION OF THE PREFERRED EMBODIMENTS

Figure 1:
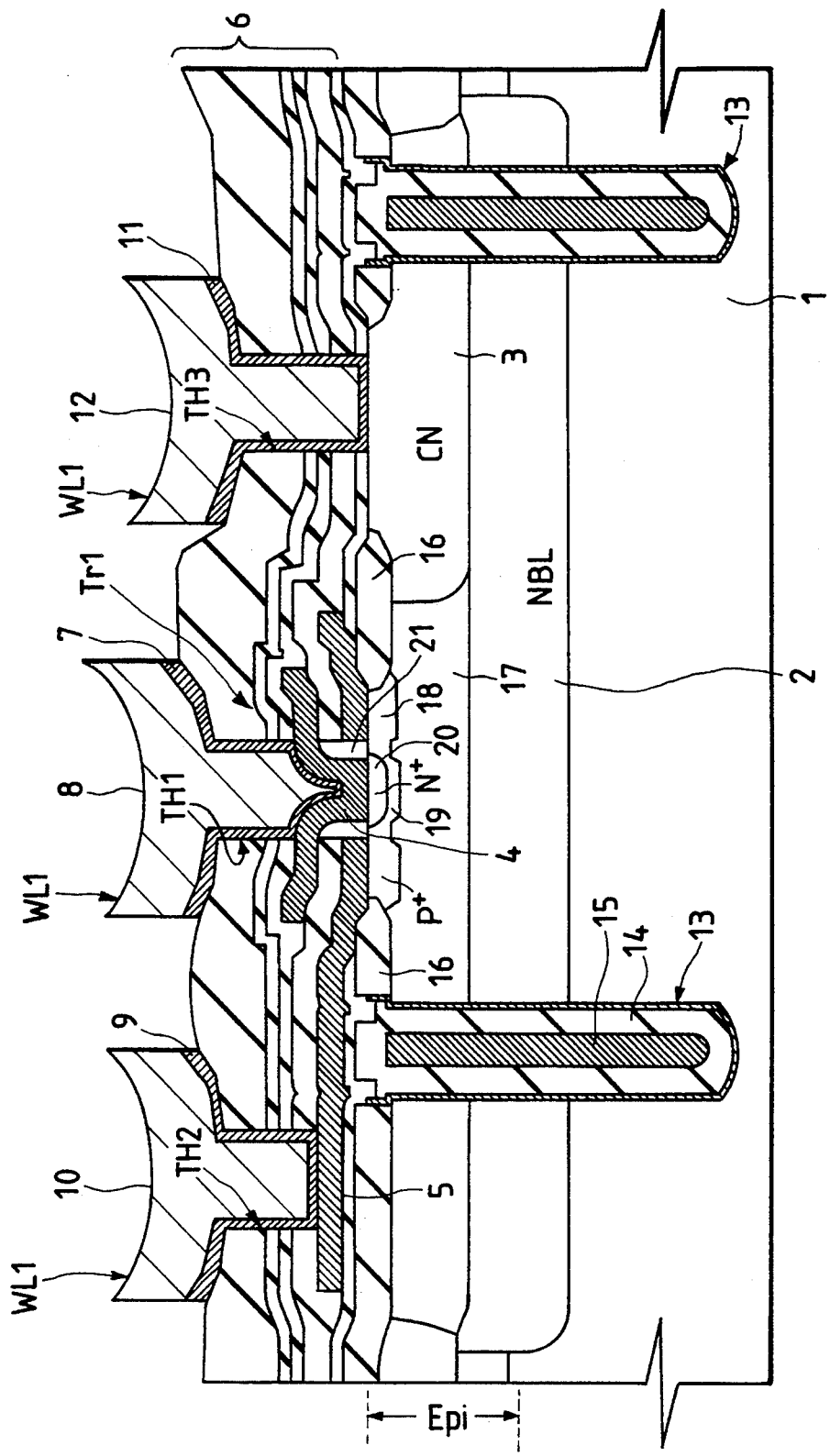
FIG. 1 is a sectional view of a major portion of a semiconductor device that includes bipolar transistors according to a first embodiment of the present invention.

The constitution of the present invention will now be described by way of embodiments.

In all of the diagrams for explaining the embodiments, the portions having the same functions are denoted by the same reference numerals but their description is not repeated.

Embodiment 1

An embodiment 1 of the present invention will now be described with reference to FIG. 1 which is a partial sectional view of a bipolar transistor Tr1 on which a first wiring layer WL1 is formed in a bipolar semiconductor device or in a bipolar CMOS device.

In FIG. 1, reference numeral 1 denotes a p-type single-crystal semiconductor substrate, 2 denotes an n+-type buried layer (NBL layer), 3 denotes a high-concentration diffusion layer which is a collector contact region, 4 denotes an n+-type emitter polysilicon, 5 denotes a p+-type base-drawing polysilicon, and reference numeral 6 denotes a multilayered insulating film as a passivation chiefly composed of a silicon oxide film.

The bipolar transistor Tr1 is provided in the main surface of an n-type epitaxial layer Epi formed on the semiconductor substrate 1. The bipolar transistor Tr1 is constituted chiefly of an emitter region including an n+-type semiconductor region 20, an intrinsic base region including a p-type semiconductor region 19, and a collector region including an n-type well region 17. The collector region includes an NBL layer 2 and a collector contact region (CN) 3 for lowering the collector series resistance. Further, the base region includes an outer base region which is a p+-type semiconductor region for lowering the base resistance. The bipolar transistor Tr1 is surrounded by a trench isolation structure 13 that extends to the semiconductor substrate 1 from the surface of the epitaxial layer Epi, and is electrically isolated from other regions (elements). The trench isolation structure 13 includes an insulating film 14 such as a silicon oxide film formed on the inner surface of a groove, and a polysilicon 15 filled in the groove.

A thick oxide film (field oxide film) 16 is selectively formed on the surfaces of the epitaxial layer Epi and the trench isolation structure 13. The emitter polysilicon 4 is electrically isolated from the base polysilicon 5 by a side-wall spacer 21 composed of an insulating film provided on the side of the base polysilicon 5.

On the insulating film 6 is provided the first wiring layer WL1, in which reference numerals 7 and 8 denote emitter wirings, 9 and 10 denote base wirings, and 11 and 12 denote collector wirings. The emitter wirings, base wirings and collector wirings are electrically connected to the emitter polysilicon 4, base polysilicon 5 and collector contact region 3 through connection holes TH1, TH2 and TH3 formed in the insulating film 6.

The first wiring layer WL1 has a laminated-film structure of two electrically conducting films. The lower layers 7, 9 and 11 are composed of tungsten films formed by the sputtering method, and the upper layers 8, 10 and 12 are composed of tungsten films formed by the CVD (chemical vapor deposition) method. The films 7, 9 and 11 have thicknesses of generally from 20 to 200 nm, and the films 8, 10 and 12 have thicknesses of generally from 100 to 500 nm though they way vary depending upon the semiconductor devices.

In this embodiment, the tungsten films 8, 10 and 12 are used for the first wiring layers only. The first wiring layers are adapted to relatively short distances only such as among the neighboring bipolar transistors only or within the cells in a bipolar gate array. Therefore, even though tungsten which is a wiring material has a large resistance as described above, the bipolar semiconductor device or the bipolar CMOS device as a whole does not exhibit a large resistance. Accordingly, the CR time constant is maintained small and the signal delay does not take place. Though not shown, the second and subsequent wiring layers are made up of aluminum alloy wirings or like wirings having a small resistance.

The following effects are exhibited by the above embodiment 1.

First, the state of filling in connection holes, i.e., deposition property is improved owing to a high coverage layer formed by the CVD method.

Second, employment of the tungsten film helps improve resistance against the electromigration of the wirings on the flat portions, enabling reliability to be enhanced.

Third, the tungsten film as an adhesion layer formed by the sputtering method helps stabilize the interface properties relative to the lower electrically conducting layer, and makes it possible to maintain adhesion to the high coverage layer formed by the CVD method.

Fourth, the tungsten film works as a reflection-preventing film at the time of photolithography, and offers an increased margin against the occurrence of defective shapes.

Fifth, the tungsten film has a small sputtering efficiency compared with that of an aluminum alloy film. At the time of forming through holes for the upper wiring layer by dry etching, therefore, deposition is suppressed in the through holes and the through hole conduction yield is improved.

Sixth, the first wiring layers can be formed by using the existing technology and facilities. Thus, the reliability and yields of the products are improved without the need of introducing novel manufacturing technology or equipment.

Embodiment 2

Figure 2:
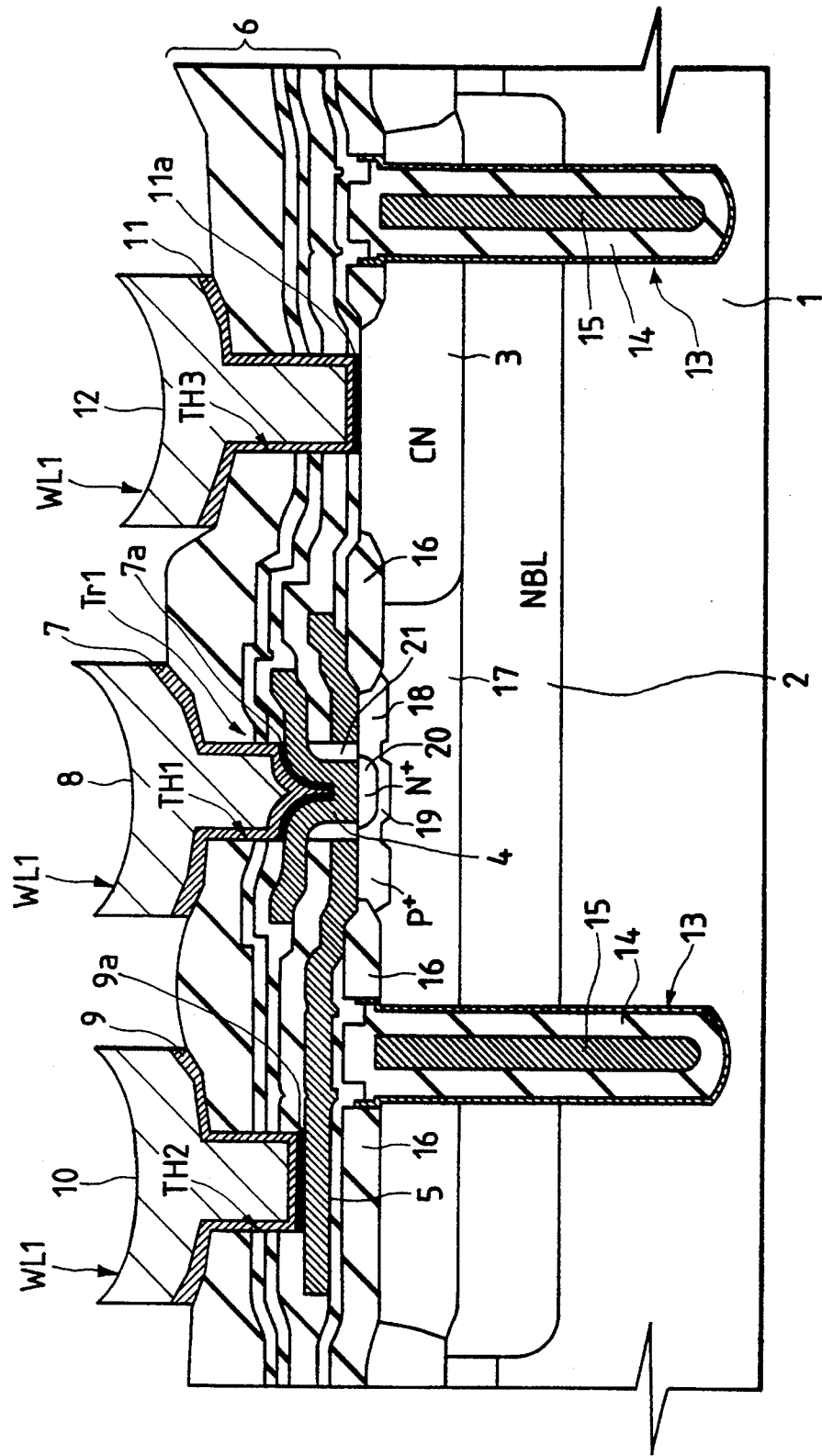
FIG. 2 is a sectional view of a major portion of a semiconductor device that includes bipolar transistors according to a second embodiment of the present invention.

An embodiment 2 of the invention will be described with reference to FIG. 2. Described below with reference to FIG. 2 are the points which are different from those of the sectional view of the embodiment 1 of FIG. 1. In this embodiment 2, the first wiring layer WL1 has a structure in which three layers are laminated, and wherein a feature resides in that electrically conducting films 7a, 9a and 11a are formed under the wiring layers 7, 9 and 12.

Of the first wiring layers WL1, the lower films 7a, 9a and 11a are platinum silicide films formed by the sputtering method and annealing method, the intermediate films 7, 9 and 11 are tungsten films formed by the sputtering method, and the upper films 8, 10 and 12 are tungsten films formed by the CVD method. The films 7a, 9a and 11a have thicknesses of generally from 20 to 100 nm, the films 7, 9 and 11 have thicknesses of generally from 20 to 200 nm, and the films 8, 10 and 12 have thicknesses of generally from 100 to 500 nm though they may vary depending on the semiconductor devices.

Here, the platinum silicate films 7a, 9a and 11a formed by the sputtering method and annealing may be replaced by titanium silicate films formed by the sputtering method and annealing, and the tungsten films 7, 9 and 11 formed by the sputtering method may be replaced by titanium nitride films.

In other respects, this embodiment is the same as the embodiment 1 and exhibits the same effects as those of the embodiment 1. Therefore, reference should be made to the description related to the embodiment 1 mentioned above.

Embodiment 3

Figure 3:
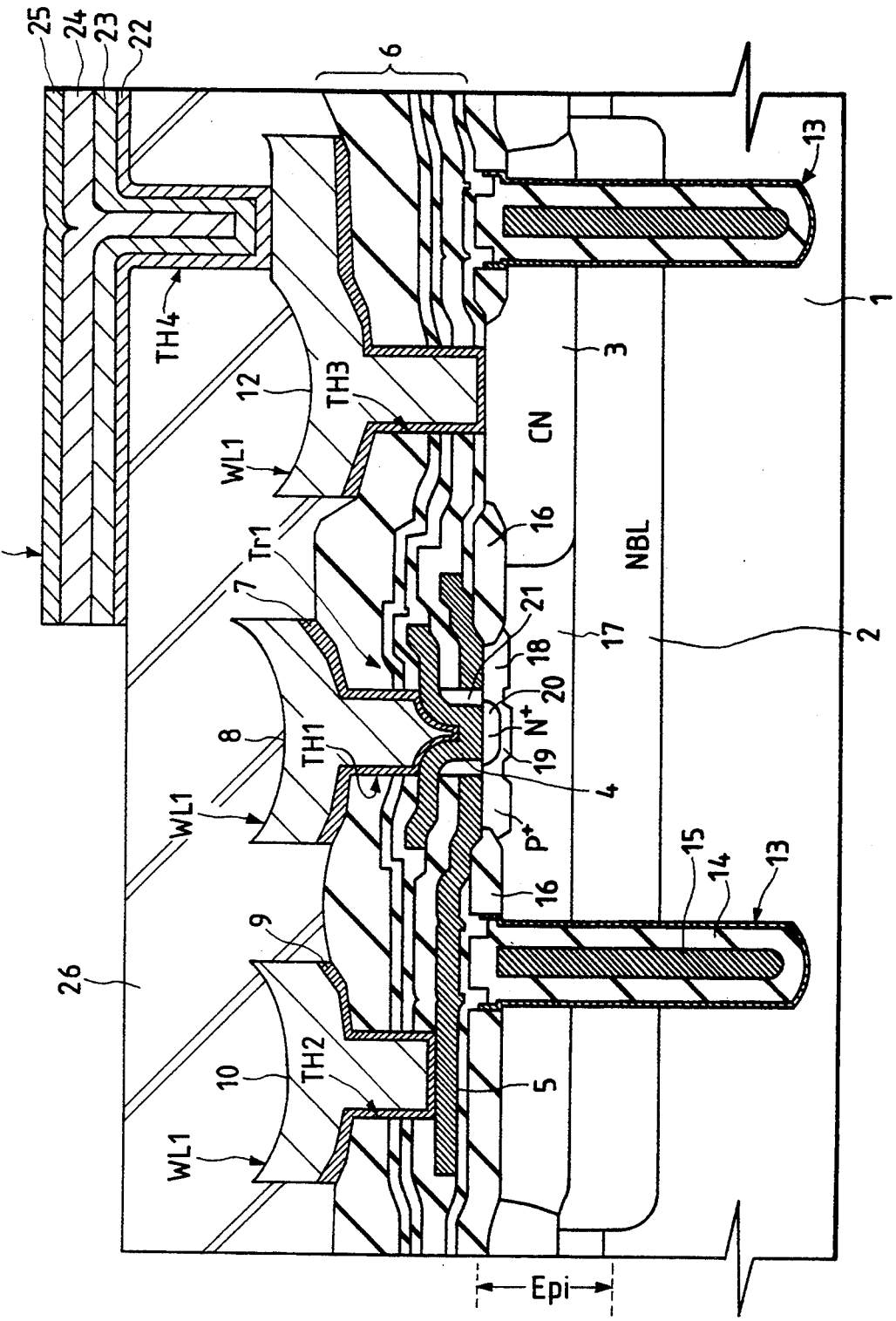
FIG. 3 is a sectional view of a major portion of a semiconductor device that includes bipolar transistors according to a third embodiment of the present invention.

An embodiment 3 of the invention will be described with reference to FIG. 3. A feature of this embodiment is that the second wiring layer WL2 has a four-layer structure. The second wiring layer WL2 has the structure in which are successively laminated a tungsten film 22 formed by the sputtering method, a tungsten film 23 formed by the CVD method, an aluminum film 24 formed by the sputtering method, and a tungsten film 25 formed by the sputtering method. The second wiring layer WL2 is formed on an interlayer insulating film 26 composed of a silicon oxide film or a like film, and is electrically connected to the first wiring layer WL1(12)

through a connection hole TH4 formed in the interlayer insulating film 26. The second wiring layer WL2 connects the elements that are relatively distant from each other, and hence includes the aluminum film 24 for the purpose of decreasing the resistance of the wiring. The other tungsten films 22, 23 and 25 are provided for the same purpose as that of the embodiment 1.

Embodiment 4

Figure 4:
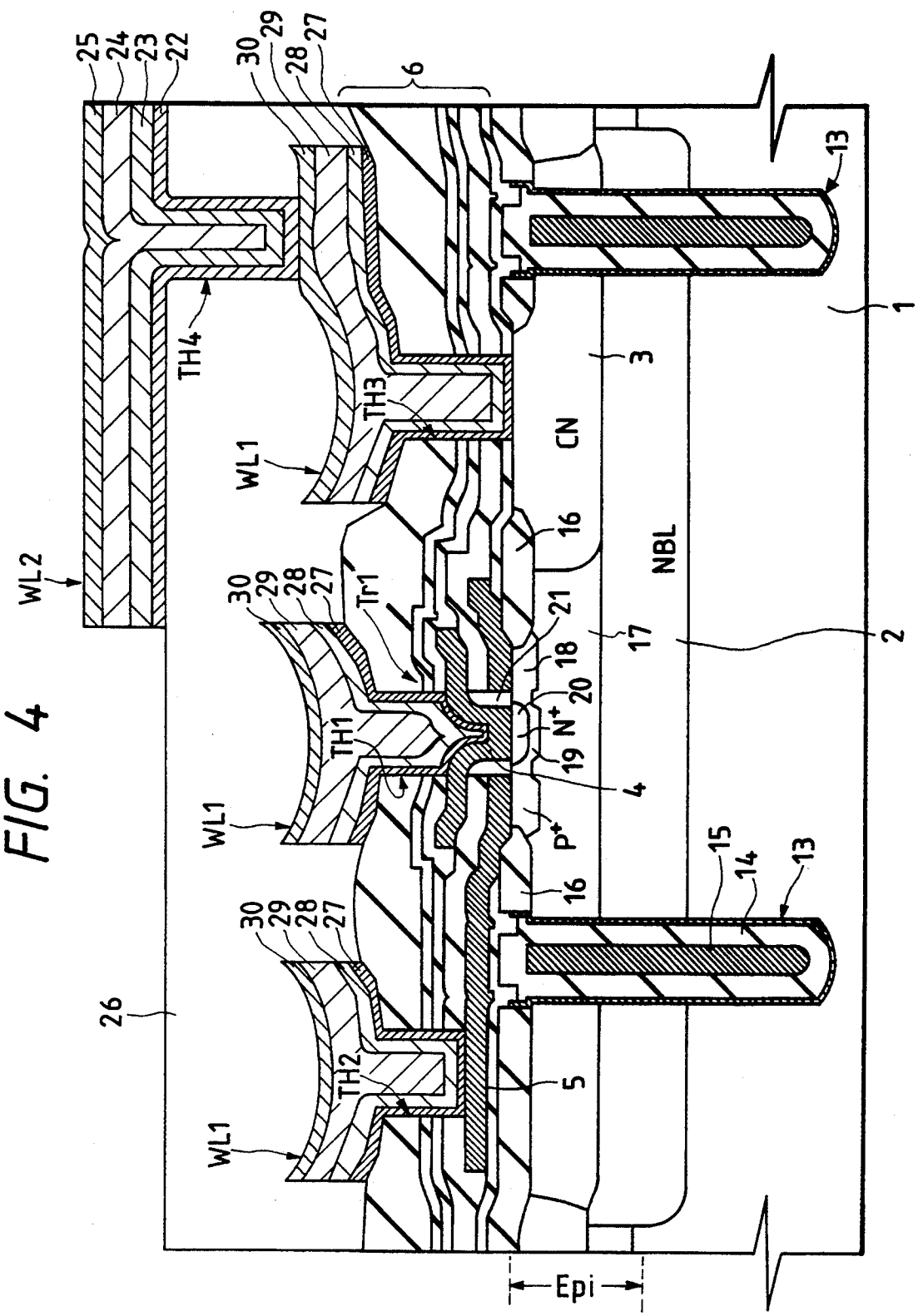
FIG. 4 is a sectional view of a major portion of a semiconductor device that includes bipolar transistors according to a fourth embodiment of the present invention.

An embodiment 4 of the invention will now be described with reference to FIG. 4. A feature of this embodiment 4 is that the first wiring layer WL1 has the four-layer structure in the same way as in the embodiment 3. The first wiring layer WL1 has the structure in which are successively laminated a tungsten film 27 formed by the sputtering method, a tungsten film 28 formed by the CVD method, an aluminum film 29 formed by the sputtering method, and a tungsten film 30 formed by the sputtering method. Moreover, the second wiring layer WL2 (22, 23, 24, 25) having the same four-layer structure as that of the embodiment 3 is electrically connected to the first wiring layer WL1 via a connection hole TH4 formed in the insulating film 26. As compared with the embodiment 1, the first wiring layer WL1 of the embodiment 4 includes an aluminum film in addition to the tungsten film formed by the CVD method and, hence, has a smaller wiring resistance contributing to improving resistance against the migration and increasing the transmission speed of signals in the semiconductor device.

In the foregoing were concretely described the invention accomplished by the present inventors by way of embodiments. The present invention, however, is in no way limited to the above embodiments only but can be modified in a variety of other ways without departing from the gist and scope of the invention.

For instance, the tungsten films 8, 10 and formed by the CVD method may be left in the connection holes by etching back.

The aluminum films 24 and 29 may be composed of an aluminum alloy (which contains copper, silicon, etc.). The platinum silicate films 7a, 9a and 11a used in the embodiment 2 may be adapted to the embodiments 3 and 4. Moreover, the present invention can be adapted to multi-layer wiring technology of three or more layers.

What is claimed is:
1. A semiconductor device comprising:
a semiconductor substrate;
a plurality of bipolar transistors provided on said semiconductor substrate, each of said plurality of bipolar transistors comprising:
   a collector region of a first conductivity type formed on said semiconductor substrate;
   a base region of a second conductivity type which is opposite said first conductivity type formed on said collector region, said base region including an intrinsic base region and an extrinsic base region surrounding said intrinsic base region;
   a field oxide layer formed on said semiconductor substrate and surrounding said base region;
   an emitter region of said first conductivity type formed on said intrinsic base region;
   a base polysilicon of said second conductivity type contacting said extrinsic base region and extending on said field oxide layer, an inner surface of said base polysilicon surrounding said intrinsic base region and defining a region where said intrinsic base region is formed;
   an emitter polysilicon of said first conductivity type contacting said emitter region and extending on said base polysilicon, said emitter polysilicon and said base polysilicon being electrically isolated from each other by a side wall spacer formed on said inner side surface of said base polysilicon; and
   a first insulating film formed on said base polysilicon, said side wall spacer defining a region where said emitter region is formed;
a second insulating film provided over said bipolar transistors; and
a first wiring layer provided on said second insulating film, said first wiring layer being electrically connected to said bipolar transistors via a plurality of connection holes formed in said second insulating film, said first wiring layer including a first tungsten film and a second tungsten film formed over said first tungsten film, said first tungsten film contacting said second insulating film at said connection holes;
a third insulating film formed over said first wiring layer; and
a second wiring layer formed on said third insulating film, said second wiring layer including an aluminum film and electrically connected to said first wiring layer via a connection hole formed in said third insulating film.

2. A semiconductor device according to claim 1, wherein said second wiring layer further includes tungsten films formed over and under said aluminum film, sandwiching said aluminum film therebetween.

3. A semiconductor device according to claim 1, wherein said first wiring layer is a laminated wiring layer having an aluminum film laminated on said second tungsten film.

4. A semiconductor device according to claim 3, wherein said first wiring layer further includes a third tungsten film formed on said aluminum film, sandwiching said aluminum film between said second and third tungsten films.

5. A semiconductor device according to claim 1, wherein said first tungsten film is formed by a sputtering method.

6. A semiconductor device according to claim 5, wherein said second tungsten film is formed by a CVD method.

* * * * *